United States Patent
Raichle et al.

(10) Patent No.: US 7,336,462 B2
(45) Date of Patent: Feb. 26, 2008

(54) ALTERNATOR AND STARTER TESTER PROTECTION APPARATUS AND METHOD

(75) Inventors: Kurt Raichle, Owatonna, MN (US); Weixing Xia, Owatonna, MN (US); Scott Krampitz, Blooming Prairie, MN (US)

(73) Assignee: SPX Corporation, Charlotte, NC (US)

( * ) Notice: Subject to any disclaimer, the term of this patent is extended or adjusted under 35 U.S.C. 154(b) by 138 days.

(21) Appl. No.: 11/061,451

(22) Filed: Feb. 22, 2005

(65) Prior Publication Data

US 2006/0092584 A1 May 4, 2006

Related U.S. Application Data

(60) Provisional application No. 60/622,799, filed on Oct. 29, 2004.

(51) Int. Cl.
H02H 3/08 (2006.01)

(52) U.S. Cl. .................................................. 361/93.1

(58) Field of Classification Search ............ 361/93.1, 361/93
See application file for complete search history.

(56) References Cited

U.S. PATENT DOCUMENTS

| | | | |
|---|---|---|---|
| 3,745,456 A | 7/1973 | Kahler | 324/73 |
| 3,903,737 A | 9/1975 | Burden et al. | 73/118 |
| 3,936,744 A | 2/1976 | Perlmutter | 324/158 |
| 4,070,624 A | 1/1978 | Taylor | 324/158 |
| 4,500,304 A | 2/1985 | Foster | 474/138 |
| 4,666,122 A | 5/1987 | Goodard | 248/666 |
| 4,781,665 A | 11/1988 | Walker | 474/133 |
| 4,832,666 A | 5/1989 | Henderson | 474/135 |
| 4,849,665 A | 7/1989 | Kitamura et al. | 310/68 |
| 4,945,272 A | 7/1990 | Ochi et al. | 310/91 |
| 4,980,589 A | 12/1990 | Ochi et al. | 310/68 |
| 5,040,493 A | 8/1991 | Gajewski et al. | 123/41.31 |
| 5,125,376 A | 6/1992 | Williams et al. | 123/195 |
| 5,156,573 A | 10/1992 | Bytzek et al. | 474/74 |
| 5,195,366 A | 3/1993 | Duncan | 73/118.1 |
| 5,473,208 A | 12/1995 | Stihi | 310/68 |
| 5,541,840 A | 7/1996 | Gurne et al. | 364/424.03 |
| 5,550,485 A | 8/1996 | Falk | 324/772 |
| 5,689,517 A | 11/1997 | Ruparel | 371/22.3 |
| 5,701,089 A * | 12/1997 | Perkins | 324/772 |
| 5,705,870 A | 1/1998 | Thomsen et al. | 310/91 |
| 5,718,196 A | 2/1998 | Uchiyama et al. | 123/195 |
| 5,938,169 A | 8/1999 | Ogawa et al. | 248/674 |
| 6,009,363 A | 12/1999 | Beckert et al. | 701/33 |
| 6,026,461 A | 2/2000 | Baxter et al. | 710/244 |
| 6,147,426 A | 11/2000 | Lepi et al. | 310/91 |

(Continued)

Primary Examiner—Michael Sherry
Assistant Examiner—Lucy Thomas
(74) Attorney, Agent, or Firm—Baker & Hostetler LLP

(57) ABSTRACT

An method and apparatus testing an alternator and/or starter assembly including a power source for energizing the alternator and/or starter, a computer processor for monitoring electrical current supplied to energize the alternator and/or starter wherein the computer processor also monitors electrical voltage across the alternator. The invention also includes a first switch coupled to the computer processor which is enabled if excess current is required to energize the alternator; a second switch coupled to the computer processor which is enabled to place a heavy load on an output of the alternator if the voltage exceeds a maximum limit; a third switch coupled to the computer processor which is enabled if the current supplied to energize the starter exceeds a maximum limit.

17 Claims, 6 Drawing Sheets

U.S. PATENT DOCUMENTS

| | | |
|---|---|---|
| 6,175,789 B1 | 1/2001 | Beckert et al. ............... 701/33 |
| 6,181,992 B1 | 1/2001 | Gurne et al. .................. 701/29 |
| 6,226,305 B1 | 5/2001 | McLoughlin et al. ....... 370/532 |
| 6,276,194 B1 | 8/2001 | Vinton et al. ................ 73/40.7 |
| 6,292,931 B1 | 9/2001 | Dupenloup .................. 716/18 |
| 6,304,012 B1 | 10/2001 | Chen et al. ................... 310/58 |
| 6,304,016 B1 | 10/2001 | Frederick et al. ............. 310/91 |
| 6,394,250 B1 | 5/2002 | Ouchi .......................... 192/45 |
| 6,466,025 B1 * | 10/2002 | Klang ........................ 324/429 |
| 6,480,723 B1 | 11/2002 | Davidson et al. ........... 455/557 |
| 6,553,039 B1 | 4/2003 | Huber et al. ................ 370/466 |
| 6,634,896 B1 | 10/2003 | Potega ....................... 439/218 |
| 6,647,027 B1 | 11/2003 | Gasparik et al. ............ 370/519 |
| 6,674,046 B2 | 1/2004 | Bankstahl et al. ........... 219/133 |
| 6,687,263 B2 | 2/2004 | van Oldenborgh et al. .. 370/476 |
| 6,704,829 B1 | 3/2004 | Hoshi et al. ................ 710/305 |
| 6,738,696 B2 | 5/2004 | Oi ................................ 701/29 |
| 6,777,945 B2 | 8/2004 | Roberts et al. ............. 324/426 |
| 6,791,332 B2 | 9/2004 | Raichle ...................... 324/429 |
| 6,834,631 B1 | 12/2004 | Blackburn et al. ........ 123/179.3 |
| 6,895,809 B2 | 5/2005 | Raichle ....................... 73/119 |
| 6,986,292 B2 | 1/2006 | Kemnade ............... 73/862.191 |
| 2004/0118194 A1 | 6/2004 | Raichle ..................... 73/118.1 |
| 2004/0163501 A1 | 8/2004 | Chen ........................ 81/177.1 |
| 2005/0035752 A1 | 2/2005 | Bertness et al. ............ 324/120 |
| 2006/0119365 A1 | 6/2006 | Makhija .................... 324/380 |

* cited by examiner

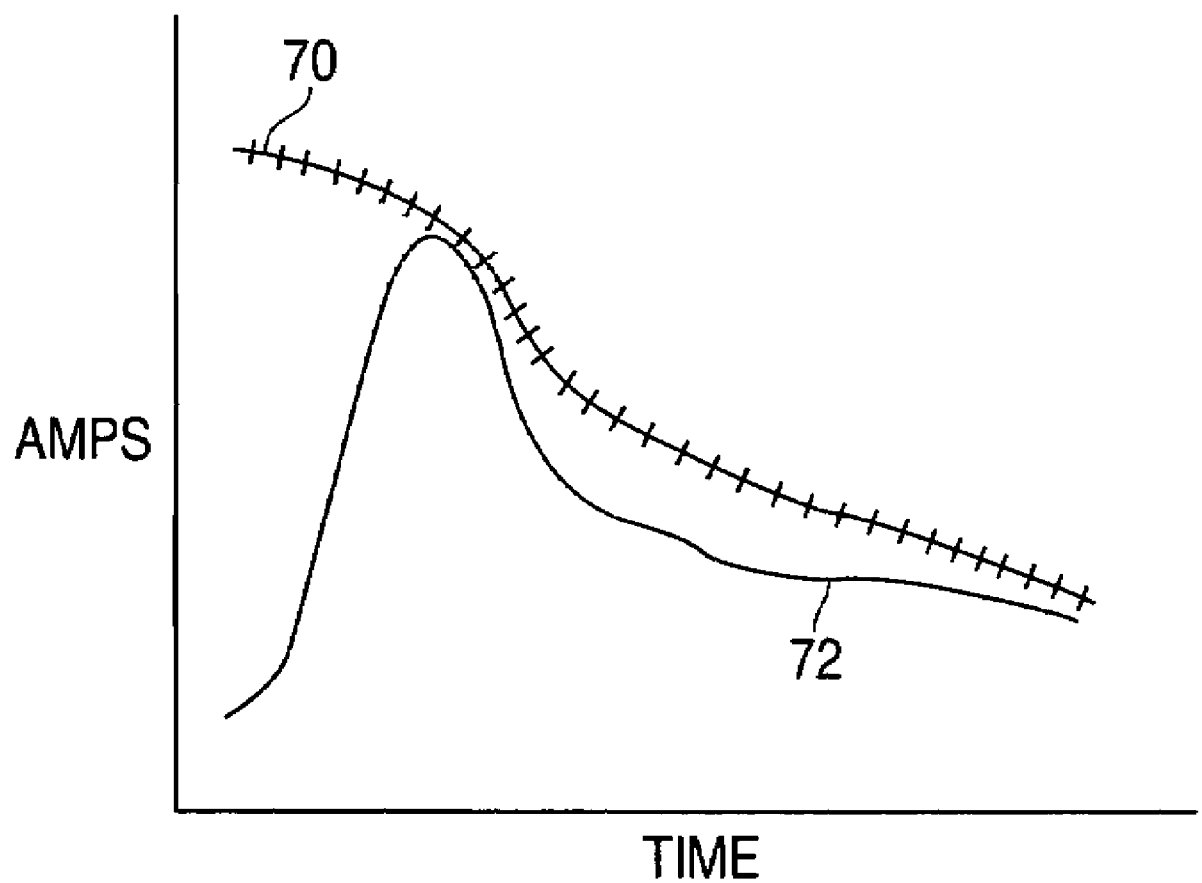

ALTERNATOR AND STARTER TESTER PROTECTION APPARATUS AND METHOD

CROSS-REFERENCE TO RELATED APPLICATIONS

This application claims priority to provisional U.S. patent application entitled, ALTERNATOR AND STARTER TESTER APPARATUS AND METHOD filed Oct. 29, 2004, having a Ser. No. 60/622,799, now pending the disclosure of which is hereby incorporated by reference in its entirety.

FIELD OF THE INVENTION

The present invention pertains to testing equipment for vehicle motor rotary accessory devices. More particularly, the invention relates to providing an apparatus and method for protecting testing equipment for vehicle motor rotary accessory devices such as for example, alternators and/or starter assemblies.

BACKGROUND OF THE INVENTION

It is well known in the vehicle industry that certain rotary accessory devices are often used in connection with vehicle motors. Two such well known accessory devices are alternators and starters. Alternators are used in connection with an engine, typically by being driven by a belt that is driven by the engine. Alternators have internal components which when rotated supply electrical power which may be used in the vehicle and/or engine. Alternators are typically removably but rigidly mounted via a bracket to the engine block or the chassis of the vehicle. In many cases, where a standard type of alternating mounting arrangement is used, the alternator has "ears" with holes that are mounted onto a post or belt attached to the vehicle permitting pivoting of the alternator so that the alternator can be pivoted around the post against the belt tension in order to install and remove belts, and provide a suitable tension when the belt is installed.

Starter motors are electrical motors which are typically removably but rigidly mounted to an engine or transmission casing and which have an electrically driven pinion gear extending from the starter motor that engages a component, typically gears on the flywheel of the engine, in order to be able to rotate the crank shaft of the engine to start it. There are a wide range of attachment mechanisms for attaching such a starter motor.

It is often desirable to test alternators and/or starter assemblies at locations where they have been removed from the vehicle, e.g., on a test bench. For example, such testing may be desirable before installing a new alternator or new starter or may be desirable for removing an existing alternator or starter for testing when diagnosing vehicle problems.

Conventional alternator and starter testers have been fairly complex in operation with limited safety features. This had been acceptable in the past due to the fact that most parts retailers employed skilled counter people and kept the test equipment behind the counters, away from the customers. As retailers have evolved into more of a merchandising customer-orientated retail environment, they have moved the test equipment to the front of the store so customers can interact with store personnel that test these components. The test is considered a service for the customers and efforts were needed to make the results legible for the customer and provide a solution to the customer's problem. The skill level of the counter person has declined as well due to increased personnel turn over. This resulted in a need for a simplified, yet accurate system to be used.

Retailers and alternator and starter component rebuilders are faced with a high percentage of the components that are returned for warranty work which are actually good and other problems in the vehicle are causing the customer's problem. This warranty problem can costs the industry millions of dollars each year. Thus, a need exists for an accurate and easy to use alternator and starter tester apparatus and method:

New alternators are becoming more complex to test. In the past, alternators were very simple in the manner in which they were energized and regulated. As technology has evolved the manner in which alternators are regulated has become more complex and diversified from manufacturer to manufacturer. Traditional test equipment has handled this technological evolution with complex and expensive methods.

Existing designs for alternator and/or starter testers may include an capability to attach a belt to the pulley of an alternator and drive the alternator belt with a motor. For testing starter motors, the starter motor may typically be connected to a device that provides power to the starter motor so the motor is selectively operated. Assembled in the prescribed manner, the alternator or starter can be subjected to significant currents and/or produce powerful voltages in an effort to test the components.

In order to prevent a prescribed voltage and/or current overload to an existing alternator and/or starter tester, mechanical devices such as circuit breakers may be integrated within an alternator and/or starter tester design. When triggered, the circuit breaker can be enacted to "pop" or provide an open circuit in an effort to discontinue applied voltage and/or current to the alternator and/or starter tester equipment. Discontinuing applied voltage loads and/or currents in the aforementioned manner may spare the alternator and/or starter tester from a certain amount of damage.

However, a certain amount of expenses an be incurred from servicing and/or replacing activated circuit breakers. Additionally, since circuit breakers are generally regarded as a mechanical device, they may have a limited life cycle which can be affected, at least to some extent, especially if the circuit breaker has been enacted one or more times. Furthermore, while a circuit breaker, for example, implemented within the design of an alternator and/or starter tester may prevent some damage, other damage may be incurred by some components of the alternator and/or starter tester equipment prior to the circuit breaker being triggered—e.g., solid state relays, high power diodes, transistors, etc. Thus, it would be desirable to provide a method and apparatus that can quickly, conveniently, safely and easily provide additional protection to alternator and/or starter tester equipment prior to triggering integrated shut-off devices such as an implemented circuit breaker device.

SUMMARY OF THE INVENTION

The foregoing needs are met, to a great extent, by the present invention, wherein in one aspect an apparatus and method is provided that in some embodiments protects the components of an alternator and/or starter testing equipment from power overload(s).

In accordance with one aspect of the invention, an apparatus for testing alternators and/or starters is provided that in some embodiments includes a power source for energizing the alternator and/or starter, a computer processor for monitoring electrical current supplied to energize the alternator and/or starter wherein the computer processor also monitors electrical voltage across the alternator. The apparatus may also include a first switch coupled to the computer processor which is enabled if excess current is required to energize the alternator, a second switch coupled to the computer processor which is enabled to place a heavy load on an output of the alternator if the voltage exceeds a maximum limit, and a third switch coupled to the computer processor which is enabled if the current supplied to energize the starter exceeds a maximum limit.

In accordance with another aspect of the invention, a method of protecting an alternator and/or starter tester is provided that in some embodiments includes energizing an alternator, monitoring electrical current supplied to energize the alternator, and enabling a shut-off switch if excess current is required to energize the alternator. The method may also include monitoring electrical voltage across the alternator, determining whether the voltage exceeds a maximum limit, and placing a heavy load on an output of the alternator if the voltage exceeds the maximum limit until the voltage is dissipated.

In accordance with another aspect of the invention, a method of protecting an alternator and/or starter tester is provided that in some embodiments includes energizing a starter, monitoring electrical current supplied to energize the starter, allowing the current to peak initially, and enabling a shut-off switch if the current exceeds a maximum limit.

In accordance with yet another aspect of the present invention, a system for protecting an alternator and/or starter tester is provided that in some embodiments includes a means for energizing an alternator, a means for monitoring electrical current supplied to energize the alternator, and means for terminating power if excess current is required to energize the alternator. The system may also include a means for monitoring electrical voltage across the alternator, a means for determining whether the voltage exceeds a maximum limit, and a means for placing a heavy load on an output of the alternator if the voltage exceeds the maximum limit until the voltage is dissipated.

In accordance with yet another aspect of the present invention, a system for protecting an alternator and/or starter tester is provided that in some embodiments includes a means for energizing a starter, a means for monitoring electrical current supplied to energize the starter, a means for allowing the current to peak initially, and a means for terminating power if the current exceeds a maximum limit.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 6 is a graph illustrating a measured current over time according to a preferred embodiment of the invention.

DETAILED DESCRIPTION

Figure 1:
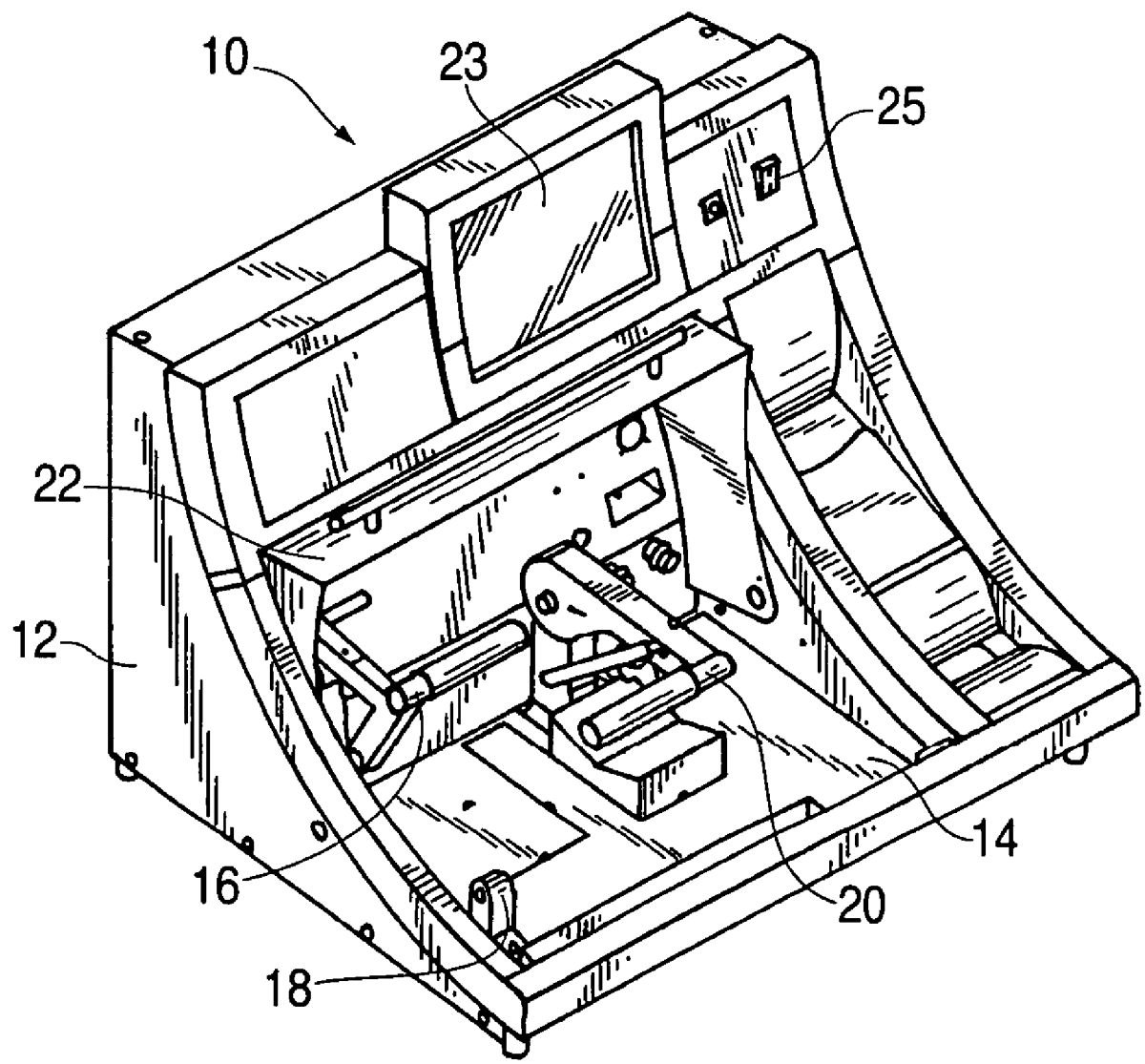
FIG. 1 is a perspective view of an alternator and starter testing apparatus according to a preferred embodiment of the invention.

The invention in some preferred embodiments provides an apparatus and method for protecting an alternator/starter testing device from undesirable and/or excessive voltage loads or applied currents. In a preferred embodiment, the invention utilizes a digital signal processor to monitor voltage and/or current measurements in order to detect a problem prior to damaging components of the alternator/starter testing device. Preferred embodiments of the invention will now be described with reference to the drawing figures, in which like reference numerals refer to like parts throughout.

FIG. 1 illustrates an alternator and/or starter testing device 10 including a housing 12 and a base plate (or chassis) 14. The housing 12 surrounds and supports various operative components of the alternator and/or starter testing device 10 including for example a power supply, diagnostic electronics, a display, a closable front cover, and the like. In a preferred embodiment, a monitor screen 23, such as an LCD touch-screen may be implemented within the housing 12 design. A power button 25, such as a toggle-switch design, is provided on the housing 12 to turn the alternator and/or starter testing device 10 on and off.

The alternator and/or starter testing device 10 also includes an alternator belt tensioning arrangement generally designated 16, an alternator mounting arrangement generally designated 18, and a starter holder arrangement generally designated as 20. Each of the belt tensioning arrangement 16, the alternator mounting arrangement 18, and the starter motor holder arrangement 20 are mounted directly to the base plate 14.

Figure 2:
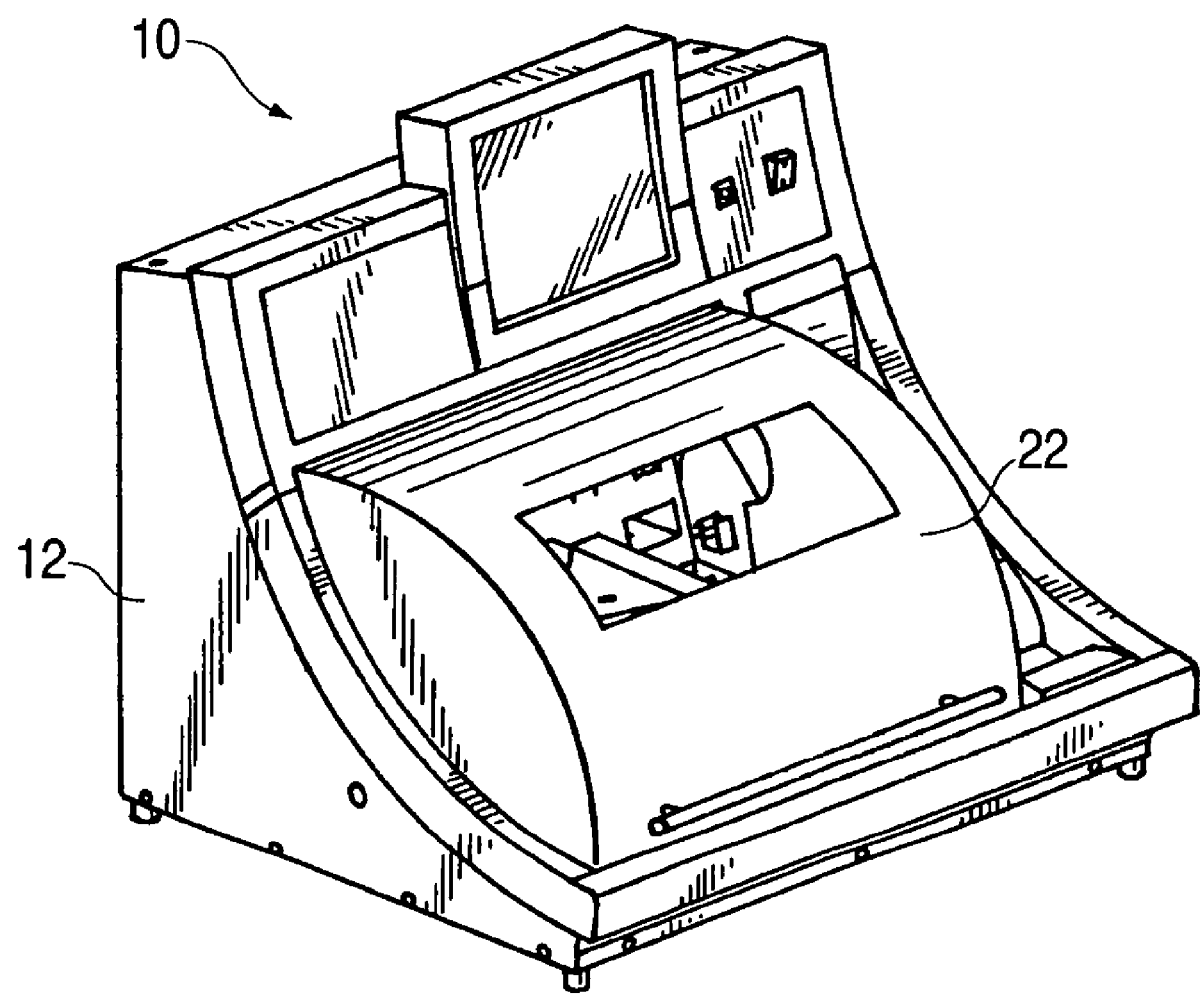
FIG. 2 is a perspective view of the alternator and starter testing apparatus of FIG. 1 depicting a protective door cover in a closed position.

In a preferred embodiment, the alternator and/or start testing device 10 incorporates enhanced safety features such as the protective door cover 22 to enclose moving parts during tests. A protective door cover 22 is provided to conceal the belt tensioning arrangement 16, the alternator mounting arrangement 18, the starter motor holder arrangement 20 and test components such as an alternator or starter equipment. Turning to FIG. 2, the protective door cover 22 of the alternator and/or starter testing device 10 is shown covering at least the belt tensioning arrangement 16, the alternator mounting arrangement 18, and the starter motor holder arrangement 20 in a closed position. In a closed position, the protective door cover 22 works to eliminate the possibility of hands getting caught in moving parts or projectiles from being thrown towards customers or store personnel. In a preferred embodiment, the protective door cover 22 has a door interlock switch 36 to disable tests while the protective door cover 22 is open.

Figure 3:
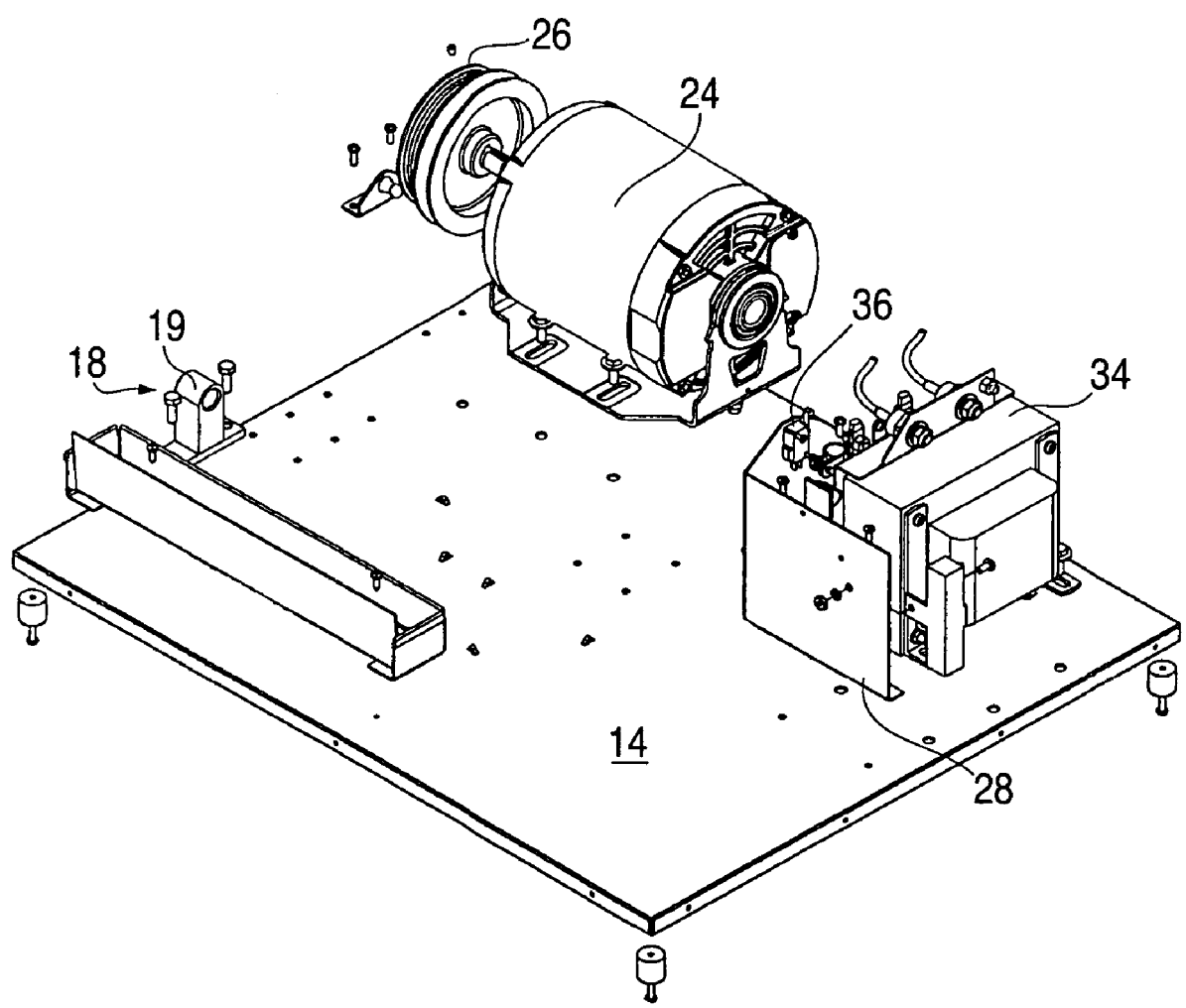
FIG. 3 is a perspective view showing a base plate of the testing apparatus of FIG. 1 with a motor and alternator mounting components.

Turning to FIG. 3, the base plate 14 is shown having a turret 19 of the alternator mounting arrangement 18. The turret 19 is mounted to the base plate 14 by bolts or other suitable attachment devices. FIG. 3 also illustrates a motor 24 that may be used to drive an alternator belt during alternator testing via a pulley 26. Motor 24 may be directly mounted to the base plate 14 by bolts or other suitable attachment devices. Additionally, a bracket plate 28 is provided to help secure the protective door cover 22 to the alternator and/or starter testing device 10. Bracket plate 28 may be directly mounted to the base plate 14 by bolts or other suitable attachment devices.

Figure 4:
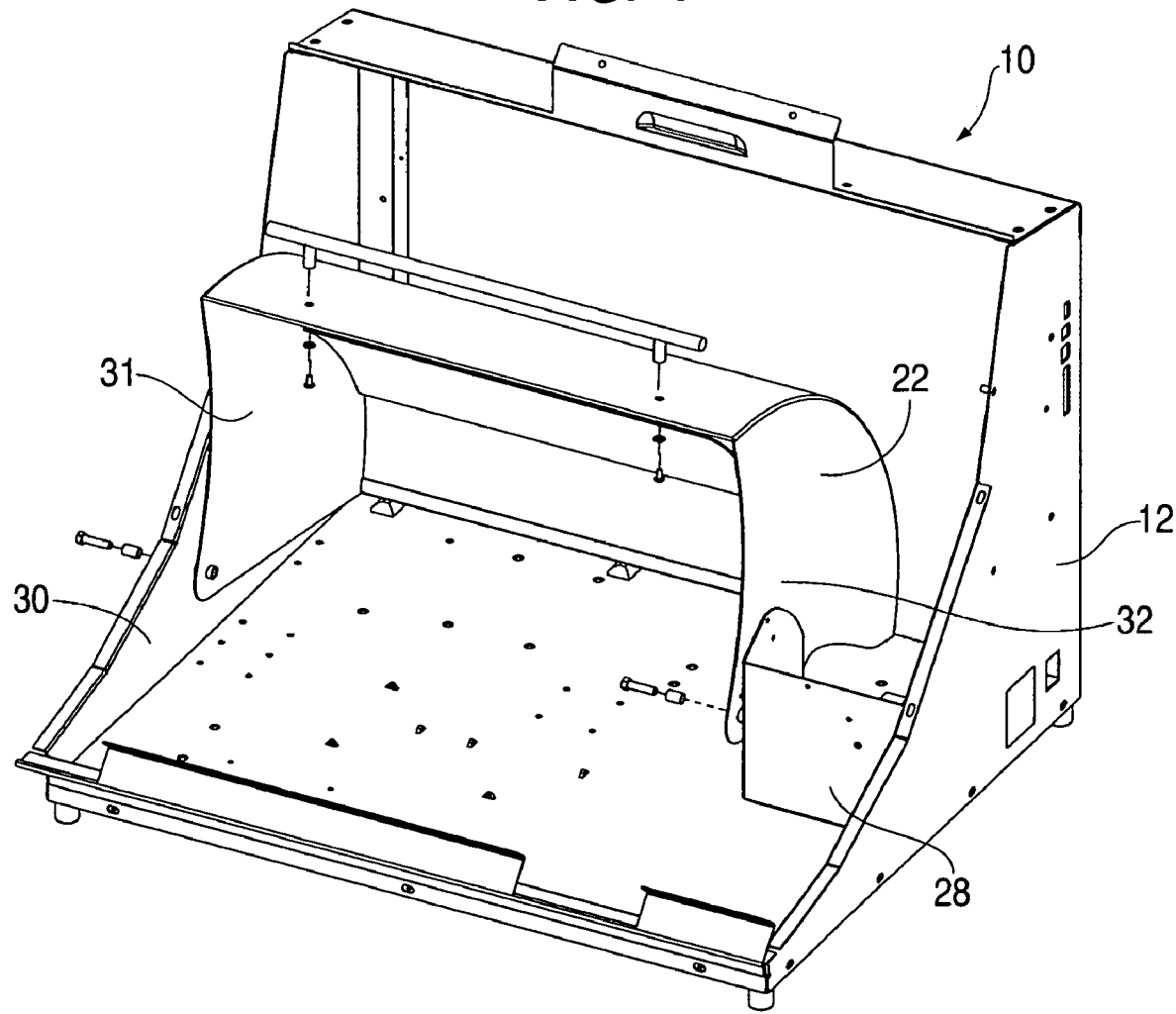
FIG. 4 is a perspective view showing a subassembly arrangement of the safety cover door with respect to the housing of the testing apparatus.

Turning to FIG. 4, the protective door cover 22 is shown in a partially assembled alternator and/or starter testing device 10. In a preferred embodiment, the protective door cover 22 is designed to fit between a sidewall 30 of the housing 12 and the bracket plate 28. Side walls 31, 32 of the protective door cover 22 may be respectively attached to an inner side wall 30 of the housing 12 and further to a portion of the bracket plate 28. Suitable attachment devices may be utilized to facilitate rotational movement of the protective door cover 22 with respected to the inner side wall 30 and the bracket plate 28. The bracket plate 28 also functions to provide additional protection to components, such as to transformer device 34 located on base plate 14. Additionally, the bracket plate 28 can provide a mounting surface for additional components such as micro-switch 36. Thus, a design of the alternator and/or starter testing device 10 provides a means for holding and testing an alternator and/or starter assembly. A description of capabilities of the alternator and/or starter testing device 10 will now be described.

The alternator and/or starter testing device 10 is preferably designed to configure itself electronically, thus, eliminating a need for setting any switches manually. The alternator and/or starter testing device 10 may include an easy to use monitor screen 23 such as the LCD touch-screen user interface which may be further connected to a controller. In one embodiment, the alternator and/or starter testing device 10 utilizes an on-line tutorial (for quickly training personnel on unit functionality) and on-line help screens (to help users navigate and test components during a test). The on-line help screens can offer step by step instructions for setting up tester and conducting tests. Such on-line help screens may include information drawn, for example, from diagrams or a specification library database which can eliminate a need for additional paper files/records such as flipcharts. Preferably, the alternator and/or starter testing device 10 includes multiple language software to provide accessibility by users of multiple languages. A database update feature may also be included to enable software updates, for example, to update specification and/or applications to support new alternator and/or starter configurations. In one embodiment, the aforementioned database may be updated by a memory device such as compact flash memory or remotely such as via network connection means.

The alternator and/or starter testing device 10 is preferably capable of providing clear outputs for conveying "Good/Bad" or "Pass/Fail" results to the user. The aforementioned outputs can improve user confidence in the results given—in contrast to conventional testers utilizing meters and lights requiring additional interpretation typically by skilled operators. The alternator and/or starter testing device 10 may also be configured in connection with a user printout device which can detail test results and provide technical advice for other potential problems.

Figure 5:
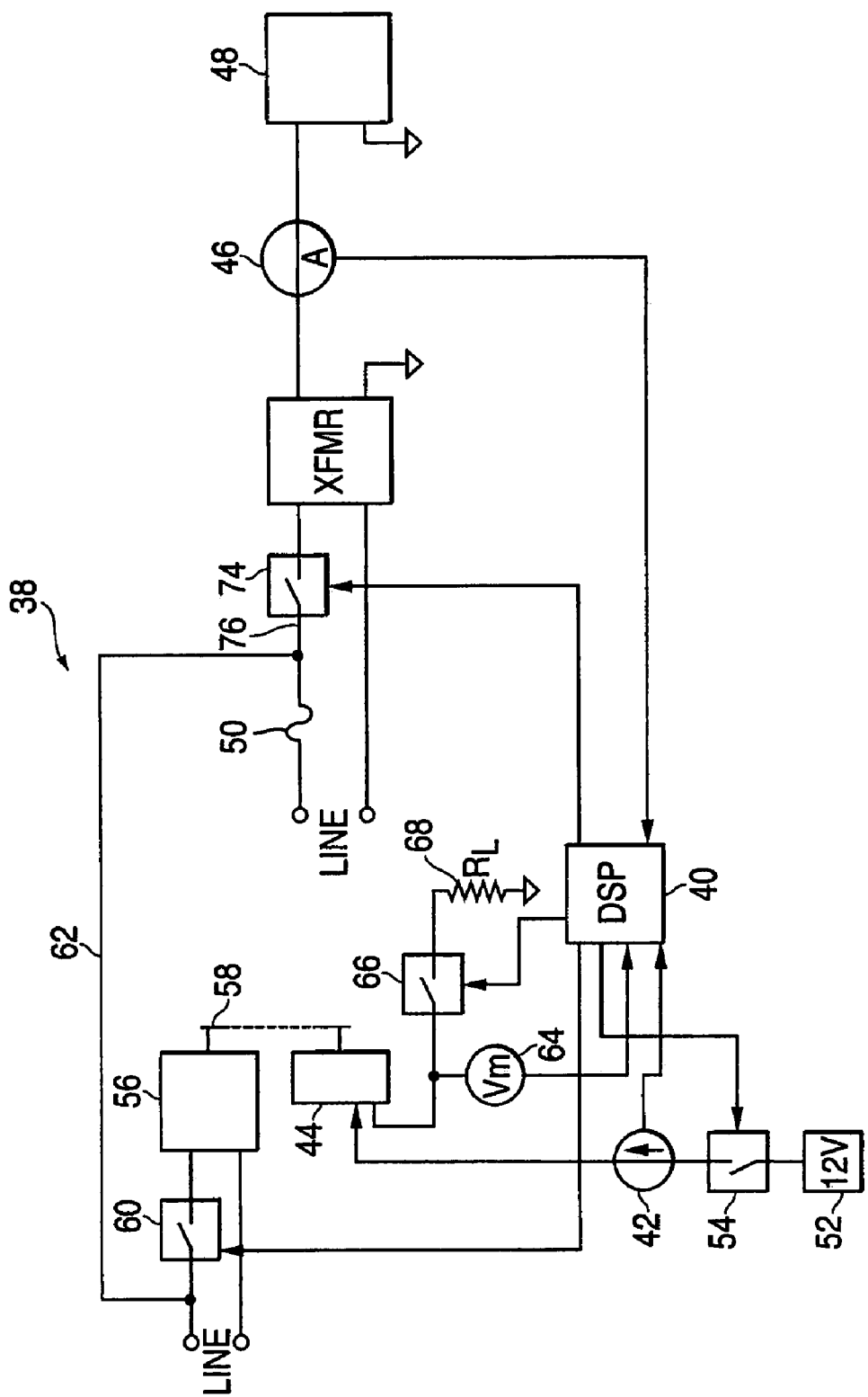
FIG. 5 is a diagrammatic view of the protection scheme for the alternator and starter testing apparatus of FIG. 1 according to a preferred embodiment of the invention.

Referring to FIG. 5 a diagrammatic view 38 of the protection scheme for the alternator and/or starter device 10 is shown according to a preferred embodiment of the invention. Circuit breakers may be implemented within conventional alternator and starter tester designs in order to protect the tester from being damaged when testing a bad alternator or starter. For example, if the alternator or starter has a failure, the circuit breaker can be designed to "pop" or open in an effort to spare the tester from damage, for instance, by short circuiting the tester; however, preventing a limited amount of damage to the tester in the aforementioned manner is not always possible. A certain amount of damage may occur to the tester, such as internal components of the tester (e.g., solid state relays, high power diodes, transistors, etc.), during a test procedure prior to the circuit breaker creating a short circuit event. Additionally, it may be desirable to prevent circuit breakers from being triggered as a cost saving measure which could otherwise require their replacement and/or additional costs of servicing the tester. Hence, an advantage of the present invention includes detecting an event which may otherwise cause the circuit breaker to be triggered and/or cause damage to the tester, and, in a preferred embodiment, shut the tester down.

A plurality of safe-guards are implemented within the alternator and/or starter testing device 10 in order to terminate power at points prior to triggering a circuit breaker device 50 as shown in FIG. 5. In a preferred embodiment, the alternator and/or starter testing device 10 is designed to utilize a fast computer processor 40, such as a digital signal processor (DSP), to monitor conditions during testing of an alternator 44 and/or a starter 48 assembly. Coupled to additional components for monitoring current, voltage and/or power termination mechanisms, the computer processor is capable of quickly responding should a fault occur in accordance with prescribed conditions. An advantage of using a fast computer processor 40 such as the DSP includes an ability to monitor and respond to current and voltage analysis in micro-seconds. This ability can provide protection to the alternator and/or starter testing device 10 by shutting the device 10 down if necessary. An additional benefit of the present invention includes shutting the alternator and/or starter testing device 10 down while preventing the circuit breaker device 50 from being triggered. Hence, high current surges, which could be registered by additional components (e.g., solid state relays, high power diodes, transistors, etc.) of the alternator and/or starter testing device 10, may never be seen or realized.

A further description of the protection scheme of the alternator and/or starter testing device 10 in accordance with a preferred embodiment will now be described. A power supply source 52 supplies power to the alternator 44 and/or starter 48. The power supply source 52 may be enabled by switch 54. The alternator 44 is coupled to a drive motor 56 via a belt connector 58. A preferred method of testing alternators includes utilizing the alternator and/or starter testing device 10 to monitor current supplied to energize the alternator 44. A DSP 40 may be configured to monitor the current (e.g., via an amp meter 42) required to energize the alternator 44 during a testing procedure. The DSP 40 may also be configured to signal the switch 54 to open in order to discontinue supplied power from the power supply 52 as needed. If excess current is required to energize the alternator 44 during a testing procedure, the test is aborted. In one embodiment, the DSP can signal the switch 54 to open in order to discontinue supplied power from the power supply 52 in order to abort the test.

In order to provide protection to the alternator and/or starter testing device 10 by addressing a potential power surge prior to triggering the circuit breaker device 50, a protection scheme is implemented for performing alternator tests. Accordingly, switch 60 is provided to protect the alternator and/or starter testing device 10 from excessive power surges during an alternator testing procedure. Switch 60 provides capability for terminating power prior to circuit breaker device 50. Line output 62 from switch 60 may be provided to a point prior to the circuit breaker device 50. The DSP 40 is connected to switch 60 in order to provide signaling accordingly. Should the alternator test be aborted, such as when excess current is required to energize the alternator 44 during a testing procedure, the DSP 40 may signal the switch 60 to open in order to cut off power prior to reaching the circuit breaker device 50. Thus, excessive power surges can quickly be detected by the DSP 40 in order to enact switch 60 to cut off power to prevent damage to internal components of the alternator and/or starter testing device 10. Furthermore, by detecting and shutting down power in response to the power surge prior to detection by the circuit breaker device 50, the integrity and/or functionality of the circuit breaker device 50 is preserved.

If the alternator 44 can energize properly, then the output voltage of the alternator 44 is monitored for excess voltage (e.g., via a voltage meter 64). The DSP 40 may be coupled to the voltage meter 64 in order to perform voltage monitoring. If the voltage exceeds a predetermined maximum limit, as monitored by the DSP 40, the test is aborted by signaling the switch 54 to open and discontinue power to the alternator 44. Additionally, the DSP 40 signals the switch mechanism 60 to open in order to cut off power prior to reaching the circuit breaker device 50. Furthermore, in a preferred embodiment, a heavy load is placed on the output of the alternator 44 to keep it from causing damage until it comes to rest. In one embodiment, the DSP 40 is configured to signal a switch mechanism 66 to close in order for a resistance load 68 to be applied.

When testing starters, a main concern can include a faulty starter that draws an excess amount of current or one that is shorted out completely. The process of monitoring a starter and its associated current may prove challenging on conventional starter testers with a limited supply current. This may be because some larger starters can initially presume characteristics close to resembling a dead short. A preferred embodiment of the invention address the aforementioned difficulties by monitoring and maintaining an envelope of current vs. time in an effort to keep from triggering a circuit breaker device 50.

Referring to FIG. 6, a graph illustrates a measured current over time. The top graph line 70 indicates maximum threshold limits prior to triggering the circuit breaker device 50. The bottom graph line 72 indicates the measured current as monitored by the DSP 40 to generate a threshold curve. An amp meter 46 may be configured to the DSP 40 in order to allow monitoring. During a starter testing procedure, the applied current can actually surge to a high peak initially but must stay below a negatively sloping curve over time. If the measured current 72 exceeds the maximum threshold limits 70 of the circuit breaker device 50, then power is shut down immediately to the starter 48. Again, the DSP 40 can signal the switch 54 to open in order to discontinue supplied power from the power supply 52.

In order to provide protection to the alternator and/or starter testing device 10 by addressing a potential power surge prior to triggering the circuit breaker device 50, a protection scheme is also implemented for performing starter tests. Accordingly, switch 74 is provided to protect the alternator and/or starter testing device 10 from excessive power surges during a starter testing procedure. Switch 74 provides capability for terminating power prior to circuit breaker device 50. Switch 74 is configured between a line output from the starter 48 and the circuit breaker device 50. Line output 76 is configured from switch 74 to a point prior to the circuit breaker device 50. The DSP 40 is configured to the switch 74. If the measured current 72 exceeds the maximum threshold limits 70 of the circuit breaker device 50, the DSP 40 can signal the switch 74 to open in order to cut off power prior to reaching the circuit breaker device 50. Thus, excessive power surges can quickly be detected by the DSP 40 in order to enact switch 74 to cut off power to prevent damage to internal components of the alternator and/or starter testing device 10. Furthermore, by detecting and shutting down power in response to the power surge prior to detection by the circuit breaker device 50, the integrity and/or functionality of the circuit breaker device 50 is preserved.

The present invention also preferably uses a solenoid output measurement which uses a method of testing starter output from measuring the chatter voltage of the output of the solenoid to validate the continuity and health of the solenoid. The alternator and/or starter testing device 10 can engage the solenoid separate from a transformer output by having a separate circuit engage the solenoid "S" terminal. The alternator and/or starter testing device 10 can conduct additional tests to ensure proper solenoid engagement and disengagement. The alternator and/or starter testing device 10 also monitors input line voltage to ensure adequate input line voltage is present to give proper current for starter tests. If low current is detected the alternator and/or starter testing device 10 gives a warning message and does not allow the alternator and/or starter testing device 10 to render a decision based on the low voltage input condition. Furthermore, the alternator and/or starter testing device 10 can measure an alternator diode ripple pattern accurately and catches faults with a rectifier bridge that could other wise go undetected.

The alternator and/or starter testing device 10 also includes internal signal generation which can emulate the signal of vehicle computers based on alternator part number. The aforementioned can eliminate a need for expensive external adapters.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of protecting an alternator and/or starter tester apparatus, comprising:
providing a circuit breaker device in the alternator and/or starter tester apparatus;
energizing an alternator;

monitoring electrical current supplied to energize the alternator;
enabling a shut-off switch if excess current is required to energize the alternator prior to triggering the circuit breaker device;
monitoring an electrical voltage across the alternator with a computer processor, wherein the computer processor comprises a digital signal processor (DSP);
determining whether the voltage exceeds a maximum limit; and
utilizing the computer processor to control placing a heavy load on an output of the alternator if the voltage exceeds the maximum limit until the voltage is dissipated.

2. The method of claim 1, further comprising:
utilizing the computer processor to monitor electrical current supplied to energize the alternator; and
utilizing the computer processor to enable the shut-off switch if excess current is required to energizing the alternator.

3. The method of claim 1, further comprising:
utilizing a switch to enable placing the heavy load on the output of the alternator.

4. The method of claim 3, further comprising controlling the switch to enable placing the heavy load via the DSP.

5. A method of protecting an alternator and/or starter tester apparatus, comprising:
providing a circuit breaker device in the alternator and/or starter tester apparatus;
energizing a starter;
monitoring electrical current supplied to energize the starter with a computer processor, wherein the computer processor comprises a digital signal processor (DSP);
allowing the current to peak initially; and
enabling a shut-off switch if the current exceeds a maximum limit with the computer processor prior to triggering the circuit breaker device.

6. A system for protecting an alternator and/or starter tester apparatus, comprising:
means for short-circuiting the alternator and/or starter testing apparatus;
means for energizing an alternator;
means for monitoring electrical current supplied to energize the alternator;
means for terminating power if excess current is required to energize the alternator;
means for monitoring electrical voltage across the alternator, wherein the means for monitoring electrical voltage comprises a computer processor;
means for determining whether the voltage exceeds a maximum limit; and
means for placing a heavy load on an output of the alternator if the voltage exceeds the maximum limit until the voltage is dissipated wherein the means for monitoring electrical current comprises the computer processor, wherein the computer processor comprises a digital signal processor (DSP); and
means for enabling the means for terminating power prior to triggering the short-circuiting means.

7. The system of claim 6, wherein the means for terminating power comprises a shut-off switch.

8. The system of claim 6, further comprising: enabling the shut-off switch via the DSP.

9. The system of claim 6, wherein the placing means comprises a switch to enable placing the heavy load on the output of the alternator.

10. The system of claim 9, further comprising:
controlling the switch to enable placing the heavy load via the DSP.

11. The system of claim 6, wherein the short-circuiting means comprises a circuit breaker device.

12. The system of claim 6, wherein the means for terminating power comprises a shut-off switch.

13. A system for protecting an alternator and/or starter tester apparatus, comprising:
means for energizing a starter;
means for monitoring electrical current supplied to energize the starter;
means for allowing the current to peak initially;
means for terminating power if the current exceeds a maximum limit;
means for short-circuiting the alternator and/or starter tester apparatus; and
means for enabling the means for terminating power prior to triggering the short-circuiting means, wherein the means for monitoring electrical current comprises a computer processor.

14. The system of claim 13, wherein the computer processor comprises a digital signal processor (DSP).

15. The system of claim 13, wherein the means for terminating power comprises a shut-off switch.

16. The system of claim 13, wherein the short-circuiting means comprises a circuit breaker device.

17. An apparatus for testing alternators and/or starters comprising:
a power source for energizing the alternator and/or starter;
a circuit breaker device;
a computer processor for monitoring electrical current supplied to energize the alternator and/or starter, said computer processor also monitoring electrical voltage across the alternator;
a first switch coupled to the computer processor which is enabled if excess current is required to energize the alternator, wherein the first switch is enabled prior to triggering the circuit breaker device;
a second switch coupled to the computer processor which is enabled to place a heavy load on an output of the alternator if the voltage exceeds a maximum limit, wherein the heavy load is maintained until the voltage is dissipated;
a third switch coupled to the computer processor which is enabled if the current supplied to energize the starter exceeds a maximum limit, wherein the computer processor comprises a digital signal processor (DSP).

* * * * *